United States Patent
Yuasa

(10) Patent No.: US 8,237,502 B2
(45) Date of Patent: Aug. 7, 2012

(54) AMPLIFIER WITH BIAS STABILIZER

(75) Inventor: Tachio Yuasa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 101 days.

(21) Appl. No.: 12/763,505

(22) Filed: Apr. 20, 2010

(65) Prior Publication Data

US 2010/0264987 A1   Oct. 21, 2010

(30) Foreign Application Priority Data

Apr. 21, 2009   (JP) .................. 2009-102984

(51) Int. Cl.
*H03F 3/45* (2006.01)

(52) U.S. Cl. ..................................... 330/259

(58) Field of Classification Search .............. 330/253, 330/257, 261, 259
See application file for complete search history.

(56) References Cited

U.S. PATENT DOCUMENTS

| 3,760,288 A | * | 9/1973 | Leonard | 330/255 |
| 4,272,728 A | * | 6/1981 | Wittlinger | 330/253 |
| 4,987,379 A | | 1/1991 | Hughes | |

FOREIGN PATENT DOCUMENTS

JP    2-108311 A    4/1990

OTHER PUBLICATIONS

P.R. Gray et al., Analysis and Design of Analog Integrated Circuits, Fourth Edition, 2001, pp. 298-317.

* cited by examiner

*Primary Examiner* — Steven J Mottola
(74) *Attorney, Agent, or Firm* — Foley & Lardner LLP

(57) ABSTRACT

An amplifier with bias stabilizer includes first to forth transistors, an amplifier unit and a resistor. The first transistor and the second transistor are connected in series between first and second power supplies and generate a first current. The third transistor is connected in a current mirror configuration to the second transistor and generates a second current corresponding to the first current. The amplifier unit generates an output signal based on an input signal and includes a fourth transistor, the fourth transistor generating a control voltage according to the second current so as to control the first transistor. The resistor is connected in series to at least one of the first to fourth transistors.

12 Claims, 6 Drawing Sheets

AMPLIFIER WITH BIAS STABILIZER

INCORPORATION BY REFERENCE

This application is based upon and claims the benefit of priority from Japanese patent application No. 2009-102984, filed on Apr. 21, 2009, the disclosure of which is incorporated herein in its entirety by reference.

BACKGROUND

1. Field of the Invention

The present invention relates to an amplifier with bias stabilizer circuit including a configuration for stabilizing bias current of the circuit.

2. Description of Related Art

Generally, an analog electronic circuit is required to keep an operating point of each circuit element continually for a stabilized operation even when the circuit is in a standby state in which no meaningful signal output is expected. For example, an amplifier unit is sometimes connected to a current bias circuit to keep an operating point of a transistor. Even in such a case, the circuit needs to satisfy other requirements, such as a reduction in circuit area or circuit volume, reduction in cost of manufacturing, and a reduction in power consumption and so on.

Note that, nowadays, the above-mentioned analog electronic circuit is sometimes mounted on an LSI (Large Scale Integrated circuit) which is composed of CMOSFETs (Complementary Metal Oxide Semiconductor Field Effect Transistors).

Japanese Unexamined Patent Application Publication No. 2-108311 (Hughes) discloses an operation amplifier having a bias current source using a Widlar current mirror circuit which is composed of MOSFETs (see FIG. 3 of Hughes). In a non-patent document (P. R. Gray, P. J. Hurst, S. H. Lewis and R. G. Meyer, "ANALYSIS AND DESIGN OF ANALOG INTEGRATED CIRCUITS Fourth Edition", John Wiley & Sons, Inc., pp. 299-317, New York, 2001.), a Widlar current mirror circuit and a peaking current mirror circuit are explained with their characteristics as well as the circuit schematics. Further, it also explains an operation principle of a self bias circuit which is a combination of these current mirror circuits and a current mirror circuit having a linear characteristic.

SUMMARY

In the case where an amplifier unit is connected to a current bias circuit, it is strongly desired to stabilize a value of a bias current generated by the current bias circuit. By this way, the operation of the amplifier unit is stabilized. Note that, in a circuit disclosed in FIG. 3 of Hughes, a current bias circuit forms positive feedback, and therefore the value of the bias current would be never stabilized.

As is clear from the above description, nowadays, it is desired to stabilize the operation of an amplifier unit connected to a current bias circuit more strongly than ever before.

A first exemplary aspect of the present invention is an amplifier with bias stabilizer including first to forth transistors, an amplifier unit and a resistor. The first transistor and the second transistor are connected in series between first and second power supplies and generate a first current. The third transistor is connected to the second transistor in a current mirror configuration and generates a second current corresponding to the first current. The amplifier unit generates an output signal based on an input signal and includes a fourth transistor, the fourth transistor generating a control voltage according to the second current so as to control the first transistor. The resistor is connected in series to at least one of the first to fourth transistors.

The control voltage according to the second current is supplied from the amplifier unit to the control terminal of the first transistor, and a resistor is connected in series to at least one of the first to fourth transistors. This circuit configures negative feedback control and stabilizes a current generated in the amplifier unit.

According to an exemplary aspect of the present invention, an operation of an amplifier unit connected to a current bias circuit can be stabilized better than ever before.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, specific embodiments of the present invention will be described in detail with reference to the drawings. Note that each exemplary embodiment is simplified and elements of exemplary embodiments are not drawn to an accurate scale for the sake of convenience of explanation. The technical scope of the present invention should not be limitedly interpreted based on the figures, because all figures are simplified. The figures are merely used for explanation of technical matters and each element shown in the figures does not reflect its accurate size. The same components are denoted by the same reference symbols throughout the drawings, and redundant description thereof is omitted as appropriate for clarification of the explanation. Further, the first, second and third exemplary embodiments can be combined as desirable by one of ordinary skill in the art.

First Exemplary Embodiment

Figure 1:
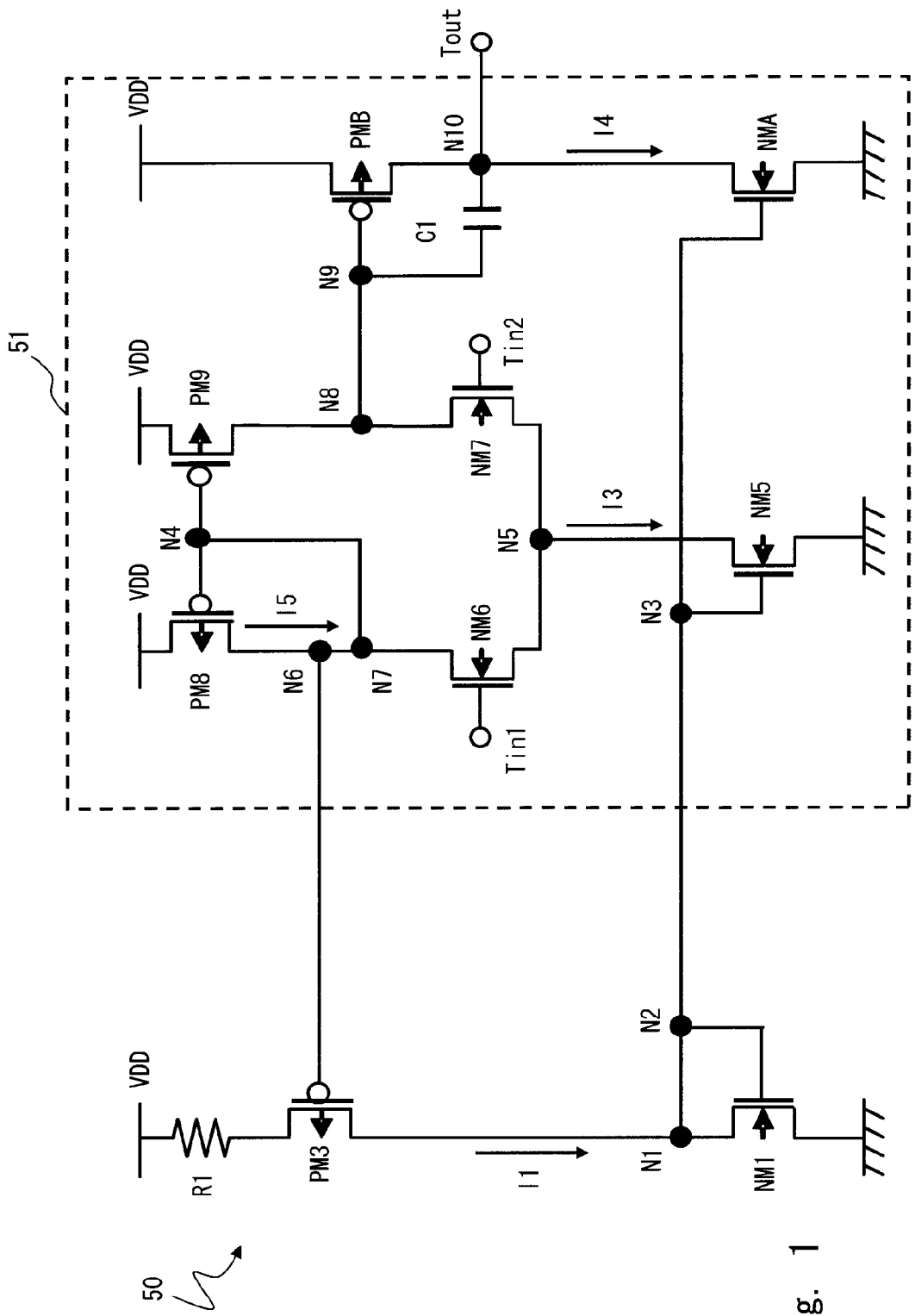
FIG. 1 is a circuit diagram showing an amplifier with bias stabilizer of a first exemplary embodiment of the present invention.

Now, a first exemplary embodiment of the present invention will be described with reference to FIG. 1. FIG. 1 is a circuit diagram showing an amplifier with bias stabilizer in accordance with the first exemplary embodiment of the present invention. Note that explanations in the above-mentioned patent document and non-patent document are incorporated in this exemplary embodiment. That is, the explanations disclosed in the above patent and non-patent documents are taken into account as support documentation. The matters described above are also applied to the other exemplary embodiments.

As shown in FIG. 1, an amplifier with bias stabilizer 50 includes a resistor R1, and MOS (Metal Oxide Semiconductor) transistors PM3, NM1, NM5 and NMA. The amplifier with bias stabilizer 50 further includes MOS transistors PM8, NM6, PM9 and NM7. The amplifier with bias stabilizer 50 further includes a MOS transistor PMB and a capacitor C1. Note that a P-type channel MOS transistor is identified by initials PM and an N-type channel MOS transistor is identified by initials NM. Hereinafter, for convenience of explanation, a MOS transistor may be simply referred to as a transistor.

Firstly, a connection relation will be described. The resistor R1, MOS transistor PM3 and MOS transistor NM1 are connected in series between a power supply (a first power supply) VDD and a ground (a second power supply) GND. The MOS transistor NM5 is connected to the MOS transistor NM1 in a current mirror configuration. Similarly, the MOS transistor NMA is connected to the MOS transistor NM1 in a current mirror configuration. A gate terminal (control terminal) of the MOS transistor NM5 is connected to a gate terminal and a drain terminal of the MOS transistor NM1. A gate terminal of the MOS transistor NMA is connected to the gate terminal and the drain terminal of the MOS transistor NM1. Source terminals of the MOS transistors NM5 and MNA are connected to GND.

The MOS transistors PM8, NM6 and NM5 are connected in series between the power supply VDD and the ground GND. Similarly, the MOS transistors PM9, NM7 and NM5 are connected in series between the power supply VDD and the ground GND. Gate terminals of the MOS transistors PM8 and PM9 are connected to each other. A node N4 between the gate terminals of the MOS transistor PM8 and the MOS transistor PM9 is connected to a node N7 between the drain terminals of the MOS transistor PM8 and the MOS transistor NM6. A node N6 between the drain terminal of the MOS transistor PM8 and the MOS transistor NM6 is connected to a gate terminal of the MOS transistor PM3. Source terminals of the MOS transistors NM6 and NM7 are connected to a drain terminal of the MOS transistor NM5. Note that a gate terminal of the MOS transistor NM6 is connected to an input terminal Tin1 and a gate terminal of the MOS transistor NM7 is connected to an input terminal Tin2. Input signals are input to the gate terminal of each of the MOS transistors NM6 and NM7 through each of the input terminals Tin1 and Tin2.

The MOS transistors PMB and NMA are connected in series between the power supply VDD and the ground GND. A node N8 between a drain terminal of the MOS transistor PM9 and a drain terminal of the MOS transistor NM7 is connected to a gate terminal of the MOS transistor PMB. The capacitor C1 is connected between a node N10 and a node N9. Note that the node N10 is located between a drain terminal of the MOS transistor PMB and a drain terminal of the MOS transistor NMA, and connected to an output terminal Tout. The node N9 is located between the above-mentioned node N8 and the gate terminal of the MOS transistor PMB.

The amplifier with bias stabilizer 50 includes a current bias unit and an amplifier unit 51. The current bias unit includes the transistors NM1, PM3, NM5 and PM8, and the resistor R1. The amplifier unit 51 includes the transistors NM5, NM6, NM7, PM8, PM9, NMA and PMB. The amplifier unit 51 is configured as a differential amplifier circuit.

The amplifier unit 51 is supplied with a bias current by the current bias unit. The amplifier unit 51 performs amplification operation while being supplied with the current generated by the current bias unit. Hereinafter, the function of each circuit will be described. Note that the explanation of technical features that are clear from the above-mentioned patent and non-patent documents will be omitted.

The transistor NM6 is a forth transistor which is connected between first and second power supplies GND and VDD, and outputs a signal according to a first input signal Tin 1. The transistor PM3 is a first transistor which is connected between the VDD and the GND and outputs a first current I1 in response to an output of the transistor NM6. The transistor NM1 is a second transistor which is connected between the transistor PM3 and the GND and flows the first current I1. The transistor NM 5 is a third transistor which is connected between the transistor NM6 and the GND and outputs a second current I3 based on the first current I1 in response to an output of the transistor NM1. The transistor NM7 is a fifth transistor which is connected the transistor NM5 and the VDD and outputs a signal according to a second input signal Tin 2. The resistor R1 is arranged in a first current pathway or second current pathway. The first current pathway is between the VDD and GND through the transistors PM3 and NM1. The second current pathway is between the VDD and GND through the transistors NM6 and NM5. In this exemplary embodiment, the resistor R1 is connected between VDD and the transistor PM3. The transistors NM6 and NM7 form a differential pair, and the amplifier unit 51 amplifies a difference between the first and second input signals.

A current I3 whose value corresponds to that of a current I1 is generated by a current mirror circuit formed by the MOS transistor NM1 and the MOS transistor NM5. A current I4 whose value corresponds to that of the current I1 is generated by the current mirror circuit formed by the MOS transistor NM1 and the MOS transistor NMA.

A current whose value corresponds to that of the current I3 flows through the MOS transistor NM6. Similarly, the current whose value corresponds to that of the current I3 flows through the MOS transistor NM7. The differential amplifier circuit is in a state so-called "imaginary short" in normal operation. That is, the input voltage of the input terminal Tin1 and the input voltage of the input terminal Tin2 are substantially the same. Therefore, a current which flows through the MOS transistor NM6 and a current which flows through the MOS transistor NM7 are substantially the same. In this case, the value of a current I5 which flows through the MOS transistors PM8 and NM6 is roughly a half of the current I3.

The current bias unit configures a Widlar current mirror circuit in which the MOS transistor PM8 serves as the input side and the MOS transistor PM3 connected to the resistor R1 serves as the output side. The Widlar current mirror circuit has such a characteristic that variations of the output current I1 are smaller than those of the input current I5, and thereby has a nonlinear characteristic between the input current and the output current. The current I1 generated by the Widlar current mirror circuit is converted into the current I5 having a linear characteristic to the current I1 by the MOS transistors NM1 and NM5 which have a current mirror configuration. When a feedback circuit is formed by combining a Widlar current mirror circuit having a nonlinear characteristic with a current mirror circuit having a linear characteristic, a current flowing through the feedback circuit has a negative feedback characteristic. Therefore, the value of the current of the feedback circuit converges into a fixed value determined by the circuit constant. By the negative feedback operation like this, the current value of the current I1 becomes more stabilized.

According to this exemplary embodiment, as described above, the resistor R1 is connected between the power supply VDD and the MOS transistor PM3, and the node N6 is connected to the gate terminal of the MOS transistor PM3. By employing this configuration, negative feedback control is achieved as mentioned above, and the currents I1, I3 and I5 generated in the amplifier with bias stabilizer 50 can be stabilized. Note that, in this case, the current I4 is also stabilized. In this exemplary embodiment, the currents I3 and I5 flowing in the amplifier unit 51 also flow in the current bias circuit. In view of this, the overall current flowing in the amplifier with bias stabilizer 50 can also be stabilized.

Reference Example

Figure 2:
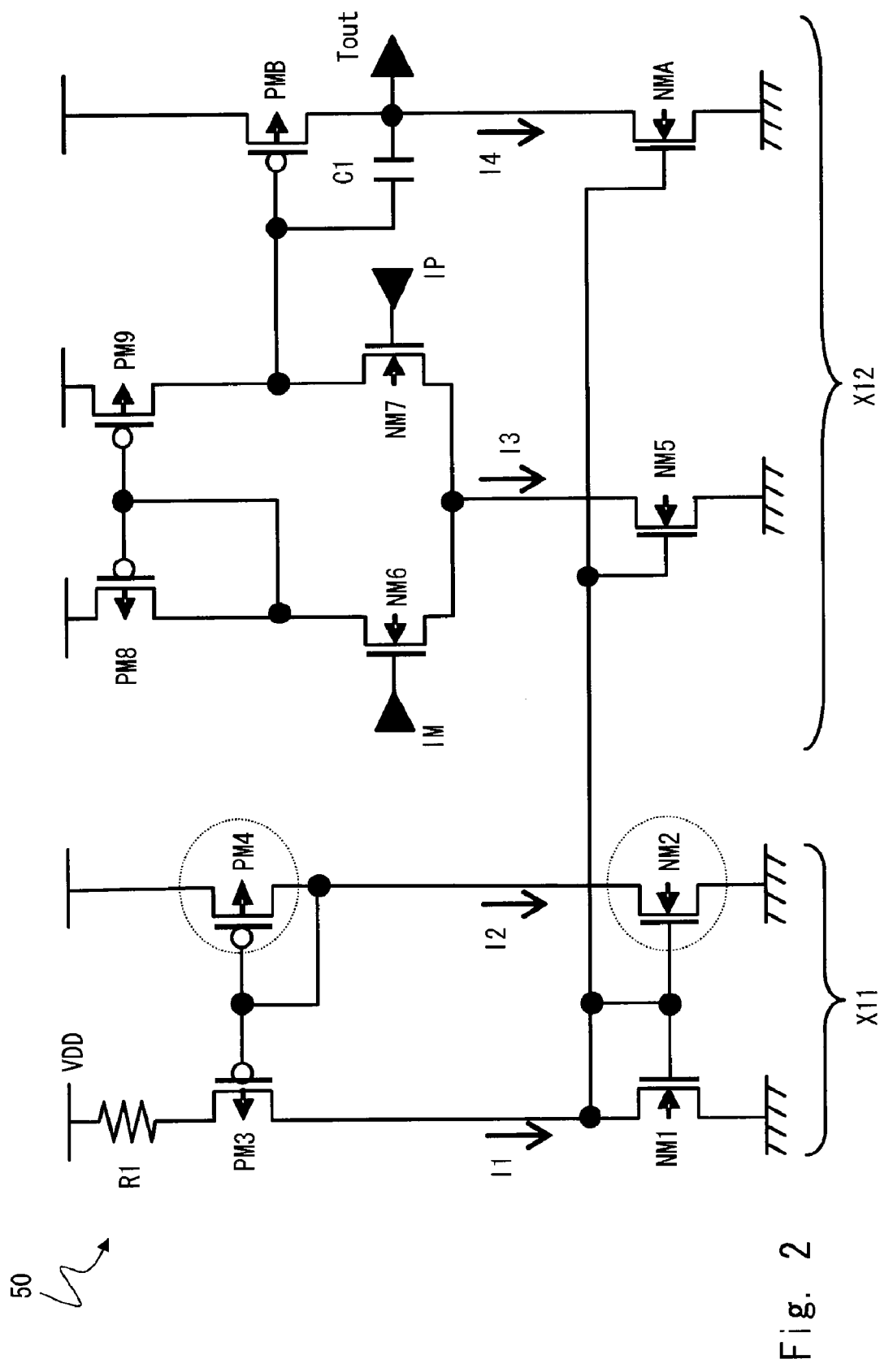
FIG. 2 is a circuit diagram showing an amplifier with bias stabilizer of a reference example of the present invention.

Next, a reference example of the present invention will be described with reference to FIG. 2. FIG. 2 is a circuit diagram showing an amplifier with bias stabilizer 50 of the reference example of the present invention.

As shown in FIG. 2, the amplifier with bias stabilizer 50 is divided into a current bias unit X11 and an amplifier unit X12. In this case, in comparison to the first exemplary embodiment, additional transistors PM4 and NM2 are required. Further, in this case, since a drain voltage of the MOS transistor NM1 and a drain voltage of the MOS transistor NM5 are not constantly equal, the current value ratio between the current I1, and currents I3, I5 could not be kept constant due to Early effect of MOSFET.

In the above-mentioned first exemplary embodiment, the node N6 is connected to the gate of the MOS transistor PM3 in view of the fact that the current I5 whose current value corresponds to the current I1 is generated in the amplifier unit. Thus, the transistors PM4 and NM2 can be omitted in the first exemplary embodiment and the area of the amplifier with bias stabilizer 50 thereby can be reduced. By reducing the area of the amplifier with bias stabilizer 50, the number of elements which can be formed in one wafer can be increased and the manufacturing cost can be reduced. Note that this point also holds true for a case where the amplifier with bias stabilizer 50 is realized in an LSI.

In the first exemplary embodiment, by reducing the number of the transistors, the power consumption corresponding to the reduced number of transistors can also be reduced. That is, the power consumption as well as the circuit area can be reduced more effectively in the first exemplary embodiment than the reference example.

In the first exemplary embodiment, the current I3 flows inside the current bias unit. Therefore, it is possible to effectively prevent the ratio of the currents between the current I1 and the current I3 from being varied. The power consumption can be reduced and operation characteristics of the circuit can be stabilized by stabilizing the bias current.

Note that it is necessary in the first exemplary embodiment to determine the relation between the currents I1 and I3 with considering operating conditions of the differential amplifier in contrast to the reference example.

Second Exemplary Embodiment

Figure 3:
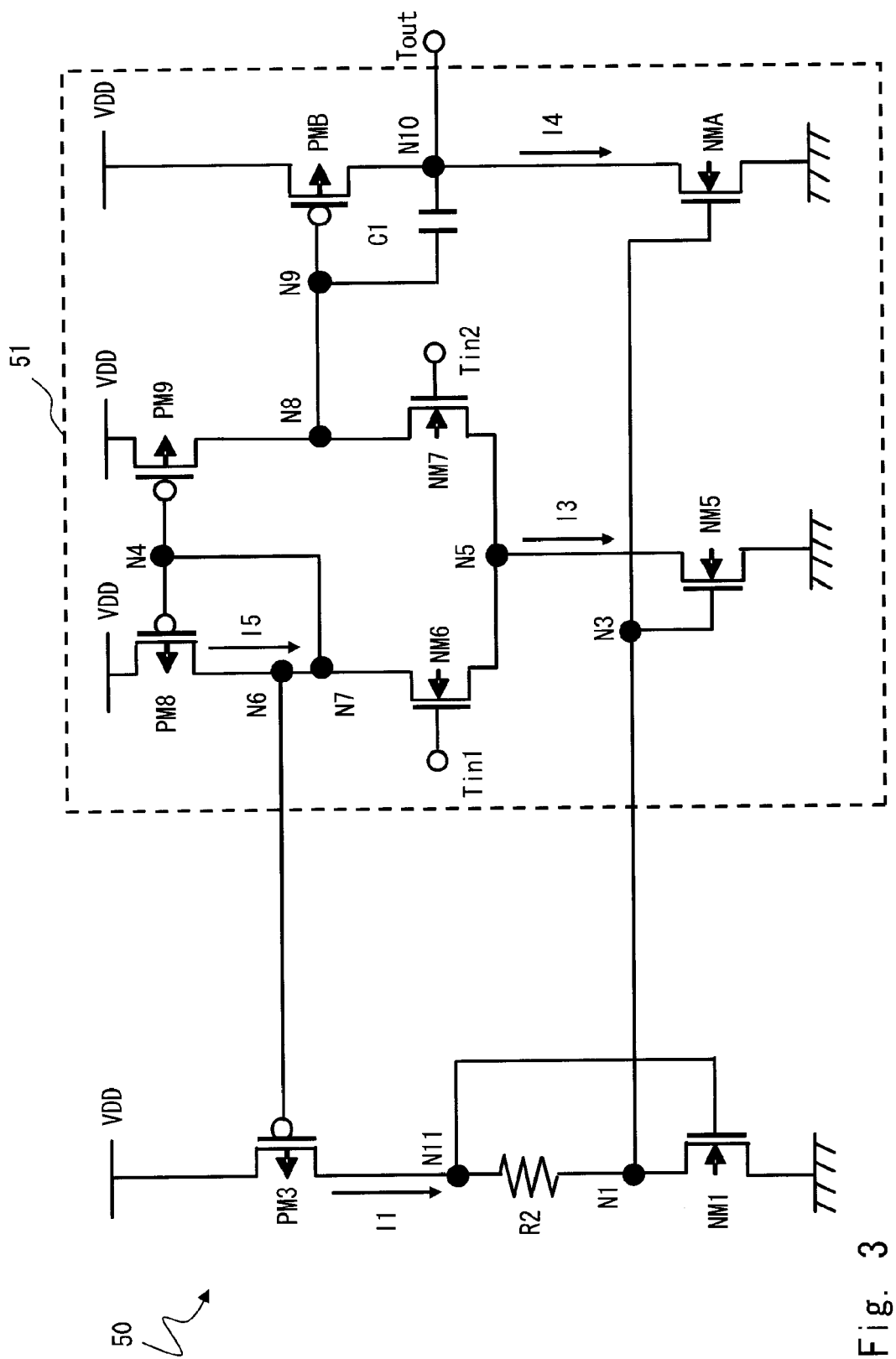
FIG. 3 is a circuit diagram showing an amplifier with bias stabilizer of a second exemplary embodiment of the present invention.

A second exemplary embodiment of the present invention will be described with reference to FIG. 3. FIG. 3 is a circuit diagram showing an amplifier with bias stabilizer 50 of the second exemplary embodiment of the present invention.

In this exemplary embodiment, unlike the first exemplary embodiment, a resistor R2, in place of the resistor R1, is connected to the MOS transistor NM1. That is, in this exemplary embodiment, a current bias unit includes a peaking current mirror having a nonlinear characteristic which partially involves an inverse proportion characteristic in the operation range between input current and output current. The peaking current mirror circuit includes the resistor R2 and MOS transistor NM1 on the input side and the MOS transistor NM5 on the output side. In this exemplary embodiment, a current mirror circuit of the MOS transistor PM8 on the input side and the MOS transistor PM3 on the output side having a linear characteristic between input current and output current is configured. Similarly to the first exemplary embodiment, as a feedback circuit is formed by combining a nonlinear circuit and a linear circuit, a bias current flowing in the amplifier with bias stabilizer 50 can be stabilized by negative feedback control.

Note that, as shown in FIG. 3, one end of the resistor R2 is connected to a drain terminal of the MOS transistor PM3, and the other end of the resistor R2 is connected to a drain terminal of the MOS transistor NM1. A node N11 between the resistor R2 and the drain terminal of the MOS transistor PM3 is connected to a gate terminal of the MOS transistor NM1. Other configuration is same as the first exemplary embodiment.

Third Exemplary Embodiment

Figure 4:
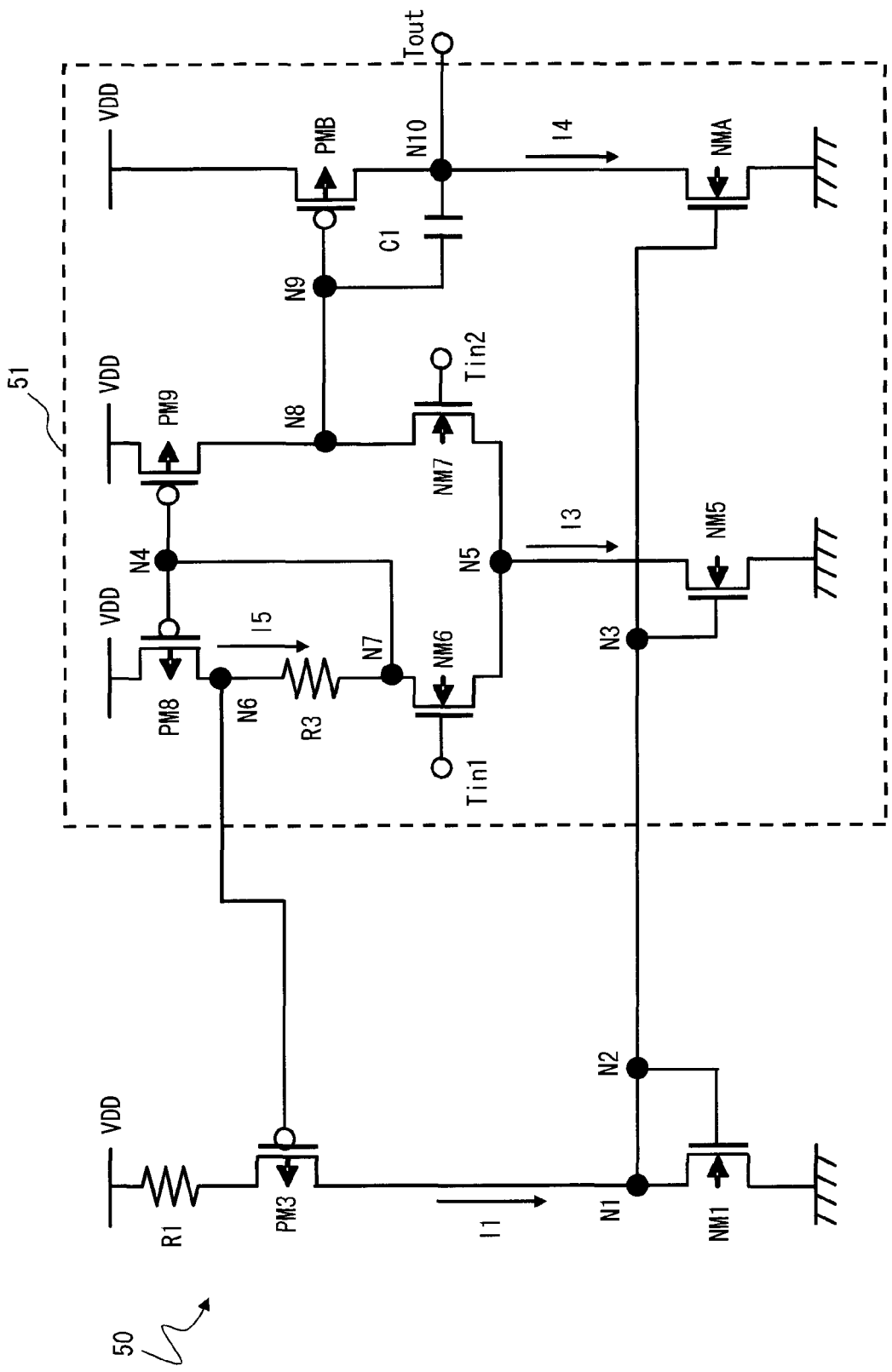
FIG. 4 is a circuit diagram showing an amplifier with bias stabilizer of a third exemplary embodiment of the present invention.

A third exemplary embodiment of the present invention will be described with reference to FIG. 4. FIG. 4 is a circuit diagram showing an amplifier with bias stabilizer 50 of the third exemplary embodiment of the present invention.

In this exemplary embodiment, in addition to the configuration of the first exemplary embodiment, a resistor R3 is connected to a node between a drain terminal of the MOS transistor PM8 and a drain terminal of the MOS transistor NM6. That is, connecting the resistor R3 to the MOS transistor PM8 implies that a peaking current mirror circuit of the resistor R3 and the MOS transistor PM8 on the input side and the MOS transistor PM3 on the output side is incorporated into the current bias unit. This makes the bias current of the amplifier with bias stabilizer 50 more stabilized than in the first exemplary embodiment. Note that this exemplary embodiment has the same effects as the first exemplary embodiment.

Fourth Exemplary Embodiment

Figure 5:
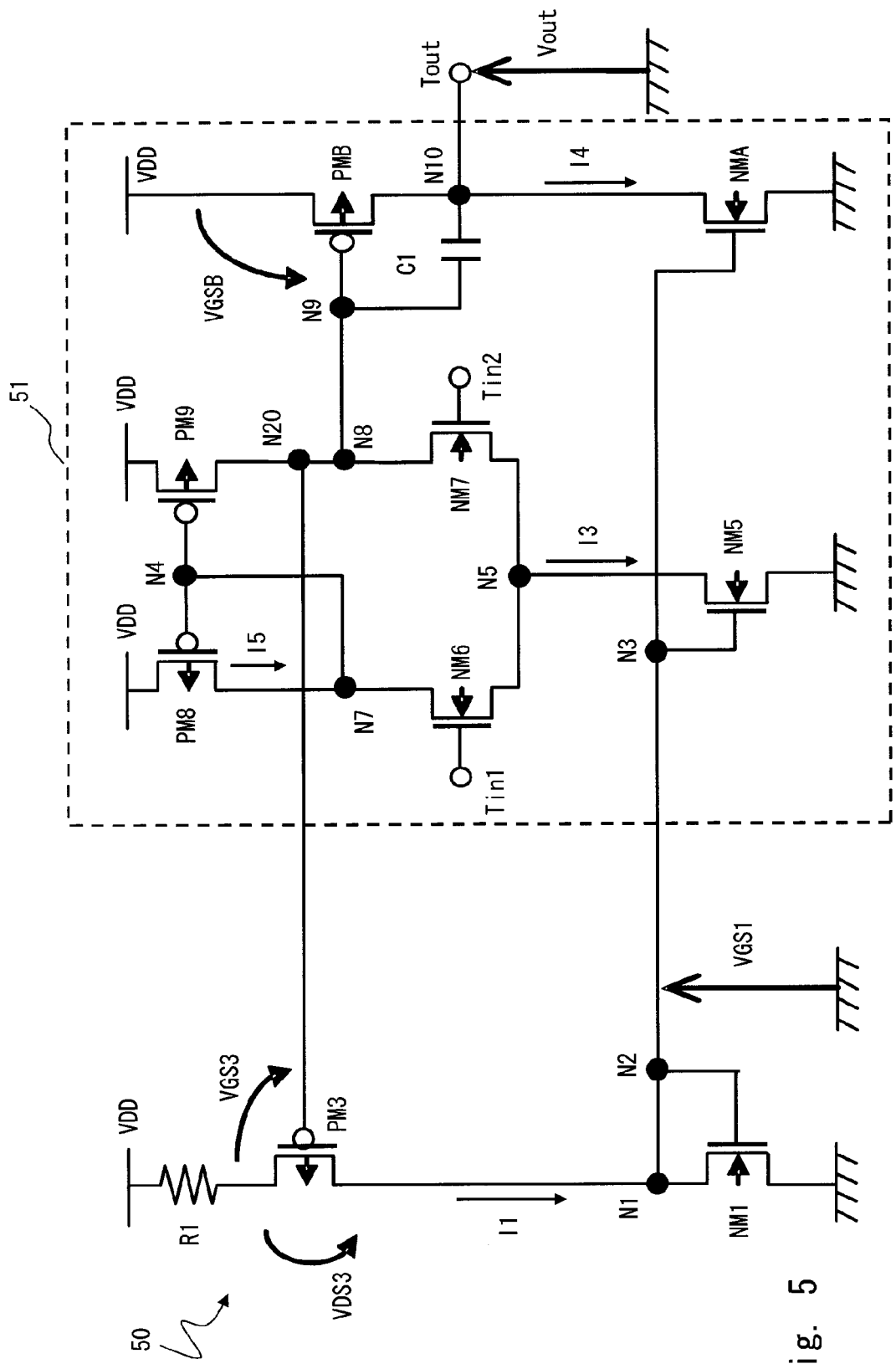
FIG. 5 is a circuit diagram showing an amplifier with bias stabilizer of a fourth exemplary embodiment of the present invention.

A fourth exemplary embodiment of the present invention will be described with reference to FIG. 5. FIG. 5 is a circuit diagram showing an amplifier with bias stabilizer 50 of the fourth exemplary embodiment of the present invention.

In this exemplary embodiment, unlike the first exemplary embodiment, a node N20 between a drain terminal of the MOS transistor PM9 and a drain terminal of the MOS transistor NM7 is connected to a gate terminal of the MOS transistor PM3. In this case, since a Widlar current mirror circuit of the MOS transistor PM9 on the input side and the resistor R1 and the MOS transistor PM3 on the output side, is configured, this exemplary embodiment achieves the same effects as the first exemplary embodiment. That is, the resistor R1 is a first resistor and the amplifier unit 51 further includes a second resistor R3 which is connected between the transistor NM6 and the VDD. The reason why an operation of the MOS transistor PM9 is the same as that of the MOS transistor PM8 is clear from the explanation about the imaginary short of the above-mentioned differential amplifier.

Hereinafter, assume the case where the input terminal Tin1 is connected to the output terminal Tout and an input voltage VDD/2 is supplied to the input terminal Tin2. Note that, in this case, a gate terminal of the MOS transistor PM3 is connected to a gate terminal of the MOS transistor PMB. The MOS transistor PMB functions as an output transistor which determines the value of the voltage output from the output terminal Tout.

When the power supply VDD increases, an output voltage Vout also increases. At this time, as the differential amplifier forms a feedback circuit, the internal resistance of the MOS transistor PMB is relatively increased, and a voltage VGSB between a gate and a source of the MOS transistor PMB thereby decreases. A voltage VGS3 between a gate and a source of the MOS transistor PM3 also decreases in response to the decrease of the voltage VGSB. On the other hand, a voltage VGS1 between a gate and a source of the MOS transistor NM1 is substantially constant. Therefore, when VDD increases, a voltage VDS3 between a drain and a source of the MOS transistor PM3 also increases. If the voltage VGS3 is not changed, a drain current of the MOS transistor PM3 increases and the value of the current I1 increases due to Early effect of the transistor PM3. However, in practice, as described above, the voltage between the gate and the source of the MOS transistor PM3 decreases in response to the increase of the power supply VDD. This can effectively avoid increase of the current value of the current I1, which would be otherwise caused by increase of the voltage VDS3 between the drain and the source of the MOS transistor PM3.

As is clear from above explanation, in the case where the input terminal Tin1 is connected to the output terminal Tout and input voltage VDD/2 is supplied to the input terminal Tin2, it is possible to efficiently prevent the fluctuation in the value of the bias current caused by fluctuation of the power supply VDD.

Fifth Exemplary Embodiment

Figure 6:
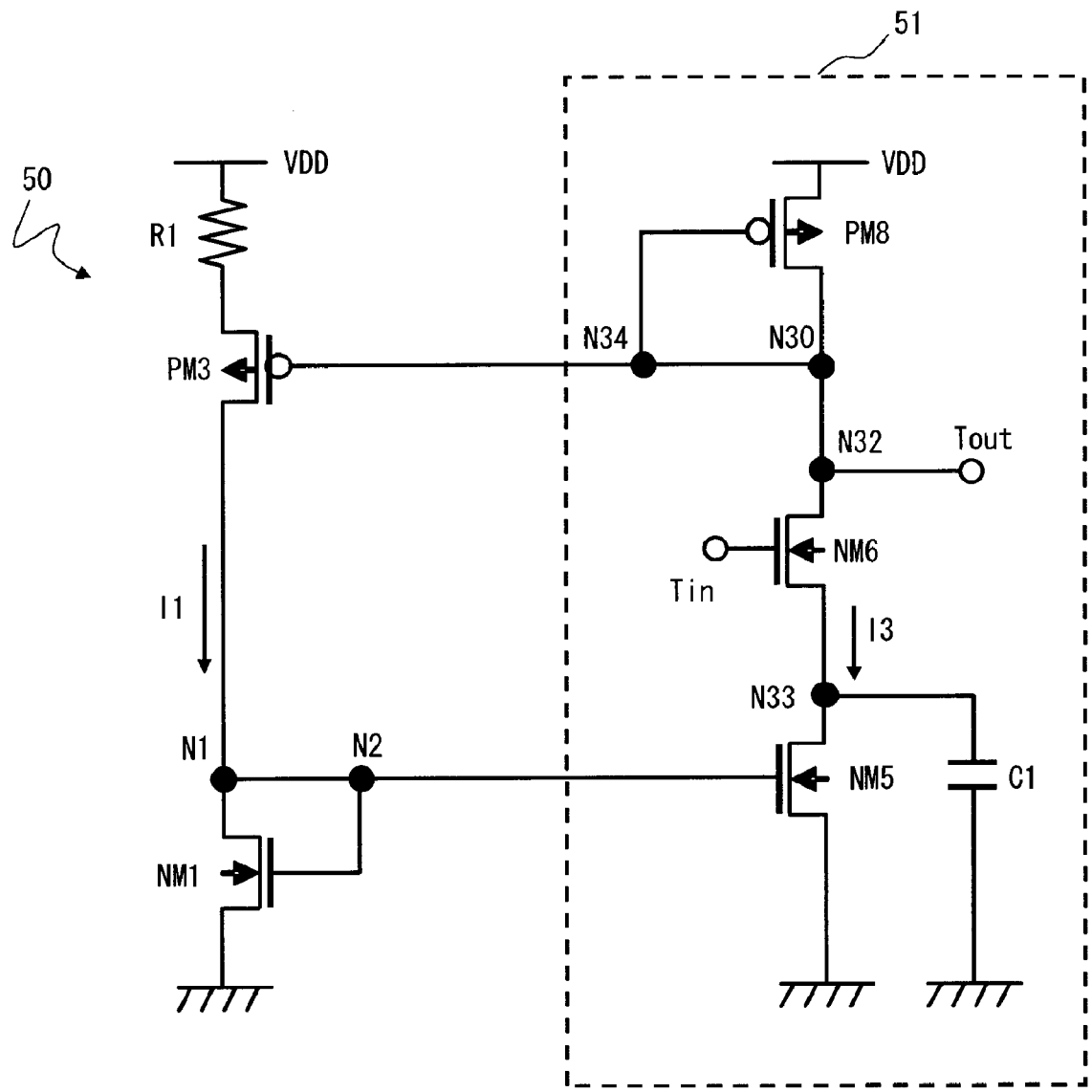
FIG. 6 is a circuit diagram showing an amplifier with bias stabilizer of a fifth exemplary embodiment of the present invention.

A fifth exemplary embodiment of the present invention will be described with reference to FIG. 6. FIG. 6 is a circuit diagram showing an amplifier with bias stabilizer 50 of the fifth exemplary embodiment of the present invention.

As shown in FIG. 6, unlike the above-mentioned exemplary embodiments, this exemplary embodiment includes a grounded source amplifier with an active load. In this exemplary embodiment, the value of the current I3 flowing from the MOS transistor PM8 to the MOS transistor NM5 also changes according to the current I1. Therefore, this exemplary embodiment can achieve the same effects as the other exemplary embodiments.

Note that the capacitor C1 of an output load is connected to a node between a node N33 and the ground. The MOS transistor NM5 functions as a transistor which supplies a bias current to the MOS transistor NM6. The input signal is supplied to a gate terminal of the MOS transistor NM6. An output signal is obtained from a drain terminal of the MOS transistor NM6. A source terminal of the MOS transistor NM6 is grounded through the MOS transistor NM5. The MOS transistor PM8 functions as an active load of the MOS transistor NM6. One end of the capacitor C1 is connected to the node N33 between a drain terminal of the MOS transistor NM5 and a source terminal of the MOS transistor NM6. The other end of the capacitor C1 is grounded.

Further, a node N34 is a node between a gate terminal of the MOS transistor PM3 and a gate terminal of the MOS transistor PM8. A node N30 is a node between a drain terminal of the MOS transistor PM8 and a drain terminal of the MOS transistor NM6. A node N 32 is a node between the output terminal Tout and the drain terminal of the MOS transistor NM6.

While the invention has been described in terms of several exemplary embodiments, those skilled in the art will recognize that the invention can be practiced with various modifications within the spirit and scope of the appended claims and the invention is not limited to the examples described above. For example, bipolar transistors can be used instead of MOSFETs. Further, a resistor may be connected between the MOS transistor NM5 and the ground. Furthermore, the resistor R1 shown in FIG. 4 may be removed so as to connect PM3 with VDD.

Further, the scope of the claims is not limited by the exemplary embodiments described above.

Furthermore, it is noted that, Applicant's intent is to encompass equivalents of all claim elements, even if amended later during prosecution.

What is claimed is:

1. An amplifier comprising:
   a first transistor and a second transistor which are connected in series between first and second power supplies and generate a first current;
   an amplifier unit; and
   a resistor,
   wherein the amplifier unit includes a third transistor and a fourth transistor, the third transistor being connected in a current mirror configuration to the second transistor and generating a second current corresponding to the first current, the fourth transistor generating an output signal based on an input signal and generating a control voltage according to the second current so as to control the first transistor; and
   the resistor is connected in series to at least one of the first to fourth transistors,
   wherein the first and fourth transistors are P-type Metal Oxide Semiconductor (MOS) transistors, and the second and third transistors are N-type MOS transistors.

2. An amplifier comprising:
   a first transistor and a second transistor which are connected in series between first and second power supplies and generate a first current;
   an amplifier unit; and
   a resistor,
   wherein the amplifier unit includes a third transistor and a fourth transistor, the third transistor being connected in a current mirror configuration to the second transistor and generating a second current corresponding to the first current, the fourth transistor generating an output signal based on an input signal and generating a control voltage according to the second current so as to control the first transistor; and
   the resistor is connected in series to at least one of the first to fourth transistors,
   wherein the resistor is connected between the first power supply and the first transistor,
   wherein the first and the fourth transistors are P-type MOS transistors, and the second and third transistors are N-type MOS transistors.

3. An amplifier comprising:
   a first transistor and a second transistor which are connected in series between first and second power supplies and generate a first current;
   an amplifier unit; and
   a resistor,
   wherein the amplifier unit includes a third transistor and a fourth transistor, the third transistor being connected in a current mirror configuration to the second transistor and generating a second current corresponding to the first current, the fourth transistor generating an output signal based on an input signal and generating a control voltage according to the second current so as to control the first transistor; and the resistor is connected in series to at least one of the first to fourth transistors, wherein the resistor is connected between the first transistor and the second transistor, wherein the first and the fourth transistors are P-type MOS transistors, and the second and third transistors are N-type MOS transistors.

4. The amplifier according to claim 2, wherein
the amplifier unit includes a fifth transistor,
the input signal is supplied to the control terminal of the fifth transistor, and
a current according to the second current is supplied to the fifth transistor.

5. The amplifier according to claim 3, wherein
the amplifier unit includes a fifth transistor,
the input signal is supplied to a control terminal of the fifth transistor, and
a current according to the second current is supplied to the fifth transistor.

6. The amplifier according to claim 2, wherein the amplifier unit is a differential amplifier including at least a pair of transistors.

7. The amplifier according to claim 3, wherein the amplifier unit is a differential amplifier including at least a pair of transistors.

8. An amplifier comprising:
a first transistor and a second transistor which are connected in series between first and second power supplies and generate a first current;
an amplifier unit; and
a resistor,
wherein the amplifier unit includes a third transistor and a fourth transistor, the third transistor being connected in a current mirror configuration to the second transistor and generating a second current corresponding to the first current, the fourth transistor generating an output signal based on an input signal and generating a control voltage according to the second current so as to control the first transistor; and
the resistor is connected in series to at least one of the first to fourth transistors,
wherein
the amplifier unit includes a fifth transistor,
the input signal is supplied to a control terminal of the fifth transistor, and
a current according to the second current is supplied to the fifth transistor,
wherein the resistor is connected between the fourth transistor and the fifth transistor.

9. An amplifier comprising:
first to fourth transistors and a resistor, wherein
the fourth transistor is connected between first and second power supplies and outputs a signal according to an input signal;
the first transistor is connected between the first and second power supplies and outputs a first current in response to an output of the fourth transistor;
the second transistor is connected between the first transistor and the first power supply and flows the first current;
the third transistor is connected between the fourth transistor and the first power supply and outputs a second current based on the first current in response to an output of the second transistor; and
the resistor is arranged in one of first and second current pathways, the first current pathway being between the first and second power supplies through the first and second transistors, the second current pathway being between the first and second power supplies through the third and fourth transistors,
wherein the resistor is connected between the first transistor and the second power supply.

10. An amplifier comprising:
first to fourth transistors and a resistor, wherein
the fourth transistor is connected between first and second power supplies and outputs a signal according to an input signal;
the first transistor is connected between the first and second power supplies and outputs a first current in response to an output of the fourth transistor;
the second transistor is connected between the first transistor and the first power supply and flows the first current;
the third transistor is connected between the fourth transistor and the first power supply and outputs a second current based on the first current in response to an output of the second transistor; and
the resistor is arranged in one of first and second current pathways, the first current pathway being between the first and second power supplies through the first and second transistors, the second current pathway being between the first and second power supplies through the third and fourth transistors,
wherein the resistor is connected between the first transistor and the second power supply,
wherein the resistor comprises a first resistor, the third and fourth transistors form an amplifier unit, and the amplifier unit further comprises:
a second resistor which is connected between the forth transistor and the second power supply.

11. The amplifier according to claims 2 or 3, wherein the amplifier unit further includes a fifth transistor, wherein the input signal is supplied to a control terminal of the fifth transistor, and a current according to the second current is supplied to the fifth transistor, and a sixth transistor and a seventh transistor connected in series between the first and second power supplies, the seventh transistor being connected in a current mirror configuration to the second transistor, the fifth transistor generating an output signal based on the input signal supplied to the control terminal of the fifth transistor to control the sixth transistor.

12. The amplifier according to claim 9,
wherein the input signal is a first input signal, the third and fourth transistors form an amplifier unit, and the amplifier unit further comprises:
a fifth transistor which is connected between the third transistor and the second power supply and outputs a signal according to a second input signal; and
a sixth transistor and a seventh transistor connected in series between the first and second power supplies, the seventh transistor being connected in a current mirror configuration to the second transistor, the fifth transistor generating an output signal based on the second input signal to control the sixth transistor;
wherein the fourth and fifth transistors form a differential pair, and
the amplifier unit amplifies a difference between the first and second input signals.

* * * * *